United States Patent [19]

Takanashi et al.

[11] Patent Number: 5,169,827
[45] Date of Patent: Dec. 8, 1992

[54] COLOR SEPARATION PLATE MANUFACTURING METHOD

[75] Inventors: Itsuo Takanashi, Kamakura; Naomi Osada; Tadao Shinya, both of Yokohama, all of Japan

[73] Assignee: Victor Company of Japan, Ltd., Yokohama, Japan

[21] Appl. No.: 745,845

[22] Filed: Aug. 16, 1991

[30] Foreign Application Priority Data

Aug. 17, 1990 [JP] Japan ................................. 2-216534

[51] Int. Cl.$^5$ ...................... B41M 5/035; B41M 5/38
[52] U.S. Cl. .................................. 503/227; 428/195; 428/913; 428/914; 430/293
[58] Field of Search .................. 8/471; 428/195, 913, 428/914; 430/293; 503/227

[56] References Cited

U.S. PATENT DOCUMENTS

4,962,081 10/1990 Harrison et al. ..................... 503/227

Primary Examiner—B. Hamilton Hess
Attorney, Agent, or Firm—Jacobson, Price, Holman & Stern

[57] ABSTRACT

A method for manufacturing a color separation plate for screen dot color printing, having screen dots recorded thereon, the size of the screen dots corresponding to the density of one of the primary colors of an image to be printed, by one of the color signals corresponding to respective primary colors and obtained by reading out the image to generate an electric signal corresponding to the image and separating the electric signal into the color signals corresponding to the primary colors, respectively. A sheet of recording material (12) which is transparent and applicable to thermal transfer recording is prepared. Also prepared is a rotatable flat platen (11). The sheet (12) of the recording material is put on the flat platen and the flap platen is rotated by a specific angle from the position where the sheet of the recording material is put on the flat platen. Then, the thermal transfer recording is performed on the sheet of recording material, in accordance with one of the color signals, to manufacture the color separation plate corresponding to one of the primary colors.

2 Claims, 6 Drawing Sheets

COLOR SEPARATION PLATE MANUFACTURING METHOD

BACKGROUND OF THE INVENTION

The present invention relates to a method for the manufacture of a color separation plate used for screen dot color printing, by thermal transfer recording.

With screen dot color printing that is used conventionally in magazines, newspapers and leaflets and the like, each of the colors of the photographic original are separated into the colors of yellow (Y), magenta (M) and cyan (C) or into these to which black (B) is added, and electric signals (color signals) corresponding to each of these colors are generated. Then, a plural number of color separation plates corresponding to each of the plural number of color signals is manufactured. Each color separation plate has screen dots recorded thereon, size of the screen dots corresponding to the density of one of those separated colors. After this, this plural number of color separation plates are used as the basis for the manufacture of machine plates corresponding to the plural number of colors and these are then overlaid to perform screen dot color printing.

These color separation plates are manufactured by exposing photographic originals onto a film through a screen dot filter and a color filter.

In addition, in one color separation plate manufacturing method that is recently used, the image is simultaneously enlarged, reduced or color-compensated by a scanner during color separation. Then, in the same manner as described above, color separation plates corresponding to the plural number of color signals are obtained by exposure.

In addition, in one extremely recent method for the manufacture of color separation plates, a scanner is used to perform color-separated image enlargement, reduction and color compensation on a computer screen. After this, using the scanner, color separation plates corresponding to the plural number of color signals are manufactured by exposing photographic originals onto a film.

The final check prior to screen dot color printing is performed using a test print from a machine plate. When the results of this final check indicate that various types of corrections are required, color separation plates corresponding to the plural number of signals must be remade. This requires a large amount of human labor and time and the plural number of color separation plates that are first made then become redundant. Furthermore, the manufacturing process becomes very expensive and there is much loss when urgency is required.

Currently, color printing technology is much more automated than it was in the past but the process for the development of the color separation plates using various types of liquids is still necessary. Because of this, there has been little progress in the facilities that are used for the process of developing the color separation plates.

SUMMARY OF THE INVENTION

In the light of this situation, the present invention has as an object the provision of a method that facilitates the manufacture of color separation plates through the use of a thermal transfer type of printing method for the color separation plates corresponding to the plural number of color signals when the screen dot color printing is performed.

In carrying out the present invention, there is disclosed a method for manufacturing a color separation plate for screen dot color printing, having screen dots recorded thereon, the size of the screen dots corresponding to the density of one of the primary colors of an image to be printed, by means of one of or color signals which are obtained by the process of: reading out the image by reading means to generate an electric signal corresponding to the image and separating the electric signal into the color signals corresponding to the primary colors respectively.

The method according to the present invention includes the steps of: preparing a sheet of recording material which is transparent and applicable to thermal transfer recording, preparing rotatable mount means provided with a flat surface, putting the sheet of the recording material on the flat surface of the mount means, rotating the mount means by a specific angle from the state where the sheet of the recording material is put on the flat surface and performing the thermal transfer recording on the sheet of the recording material by recording means, in accordance with one of the color signals, thus to manufacture the color separation plate corresponding to one of the primary colors.

BRIEF DESCRIPTION OF THE DRAWINGS

Other objects and advantages of the present invention will become apparent from the following detailed description with reference to the accompanying drawings, wherein.

DETAILED DESCRIPTION OF THE PREFERRED EMBODIMENT

The following is a detailed description of a preferred embodiment of the method of manufacture of the color separation plates according to the present invention, with reference to FIG. 1 through FIGS. 6A, 6B and 6C.

The outline of the manufacturing processes in the thermal transfer color separation plate manufacturing apparatus used in the method according to the present invention is as described below. An electric signal obtained by converting information including such as images and characters by a camera or scanner or electric signal supplied by various types of image formation apparatus is separated and divided into a plural number of electric signals (color signals) corresponding to the plural number of colors. Then, the thermal transfer printing method is used along with thermal paper of one color such as black, for example, to record the plural number of color signals to the plural number of sheets of transparent recording material, respectively. Then, these plural number of sheets of recording material thus each recorded with one of the color signals are made into a plural number of color separation plates corresponding to the plural number of color signals, respectively. If there is a plural number of color signals corresponding to yellow (Y), magenta (M) and cyan (C) for example, then a yellow color separation plate, a magenta color separation plate and a cyan color separation plate are respectively obtained on the plural number of sheets of transparent recording material. When machine plates corresponding to the respective colors are formed based on those color separation plates and overlapped with each other, the recording tracks due to each of the color signals that are recorded on these color separation plates are recording tracks so that screen dot color printing at high resolution can be performed.

The following is a description of the outline configuration of the thermal transfer color separation plate manufacturing apparatus described above. This apparatus is provided with a flat platen upon which a sheet of transparent recording material is mounted and which is freely rotatable, a recording head that is provided with a sheet of transfer material of a single color and a line thermal head that performs recording to the sheet of the transparent recording material. Furthermore, the apparatus is provided with a signal supply section that supplies the line thermal head with electric signals (color signals) that are divided according to the plural number of colors from the host computer side, and a moving section that supports the recording head so that it is freely movable in the direction of the primary scan and corresponding to the direction of the array of thermal resistor elements of the line thermal head and in the direction of the secondary scan of the apparatus.

Figure 1:
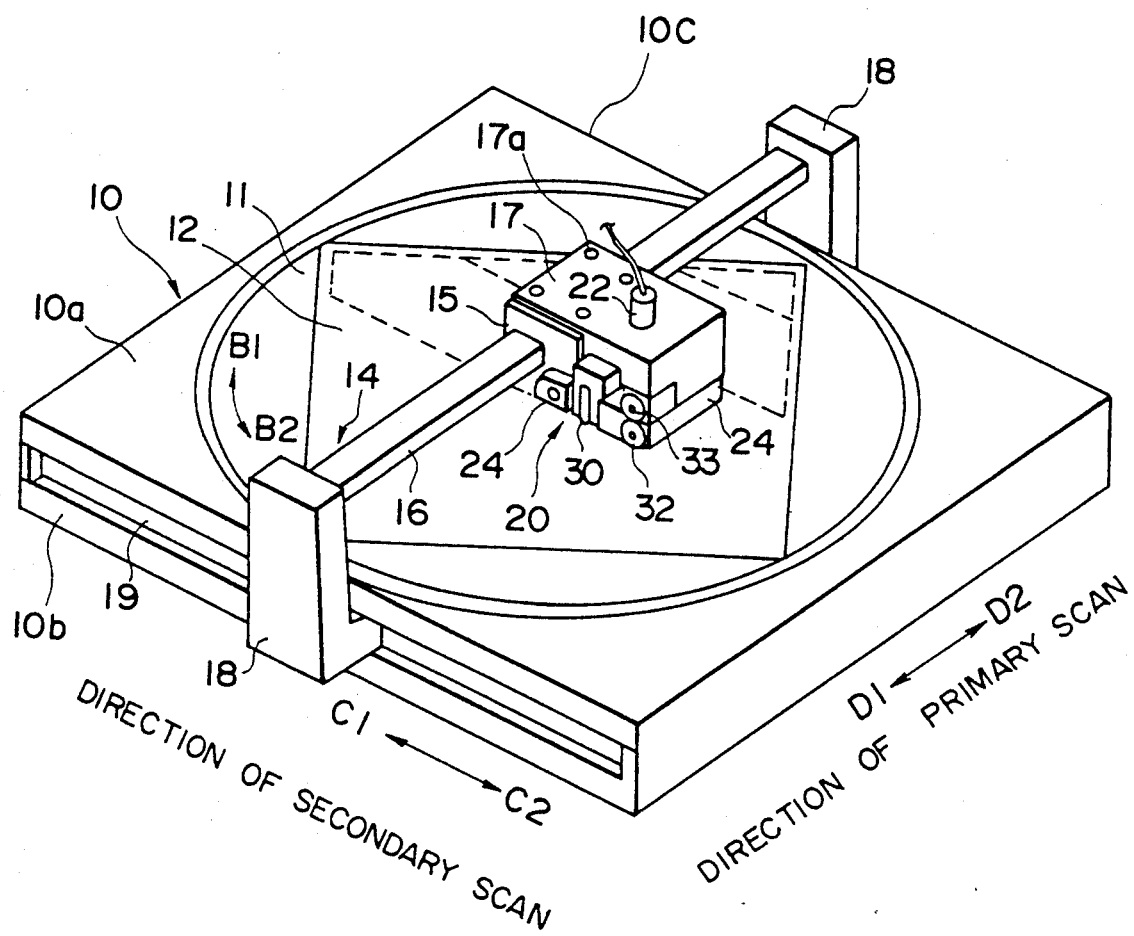
FIG. 1 is a schematic perspective view showing one embodiment of a thermal transfer color separation plate manufacturing apparatus used in the method of manufacture of color separation plates, of the present invention.

In the thermal transfer color separation plate manufacturing apparatus shown in FIG. 1, there is provided a flat platen 11 that has a flat surface on an upper surface 10a of an apparatus body 10. On the platen 11 is mounted a sheet of transparent recording material 12. This flat platen 11 is so provided that it is freely rotatable inside the apparatus (body 10) in the directions indicated by the arrows $B_1$ and $B_2$ by a pulse motor or the like, that has a speed reduction mechanism (not indicated in the figure). Moreover, the flat platen 11 does not move only through an angle of a required range, but rotates through 360° for example without obstruction.

Figure 2:
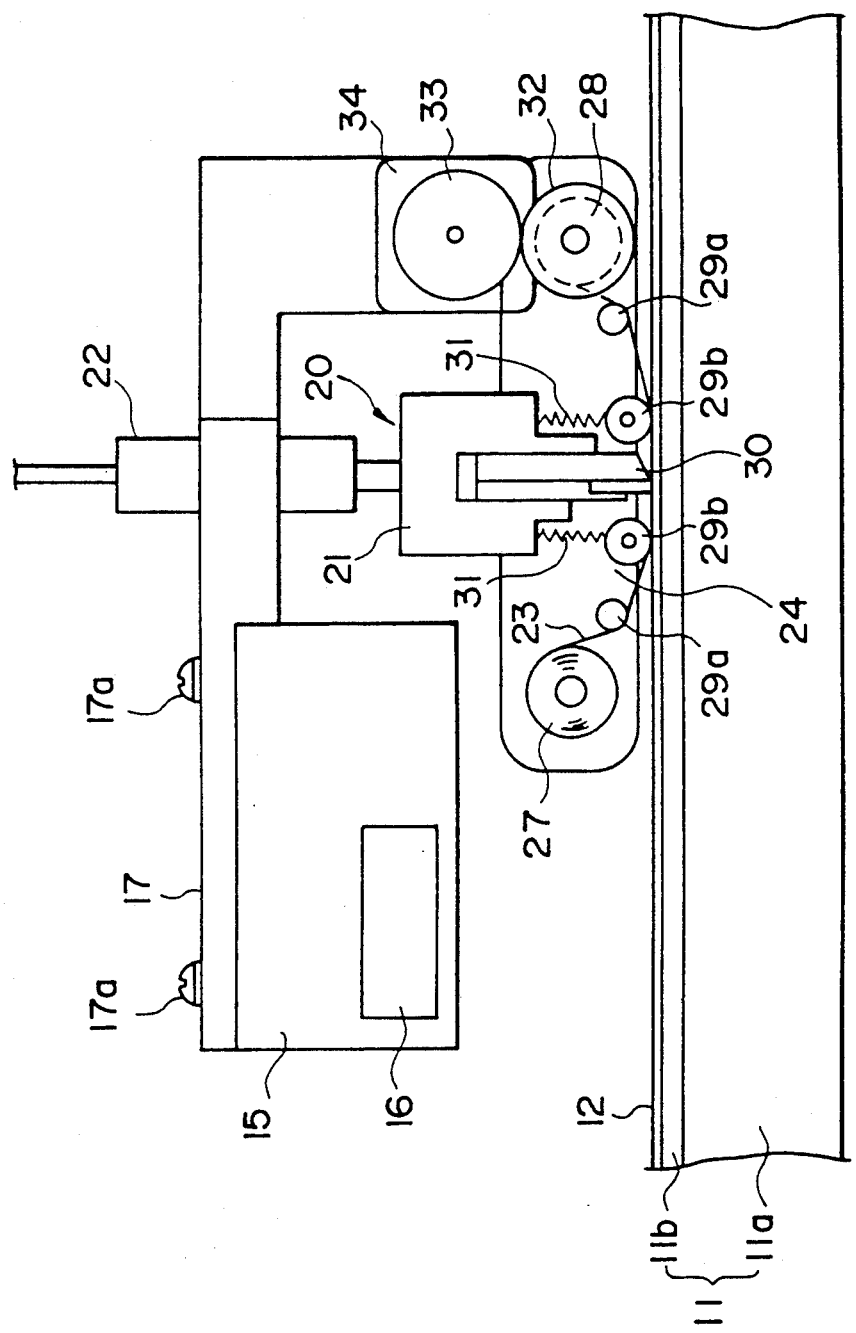
FIG. 2 is an enlarged schematic side elevational view showing a recording head that is one of the major portions of the thermal color separation plate manufacturing apparatus shown in FIG. 1.

In addition, as shown in FIG. 2, the flat platen 11 is configured from a flat unit 11a, and an elastic sheet 11b comprising an elastic substance such as rubber or the like which is affixed to the top of the flat unit 11a. Furthermore, in order to securely mount the recording material 12 on the flat platen 11, there is provided a fixing means (not indicated in the figure) that operates by vacuum suction or electrostatic adhesion.

As shown in FIG. 1, opposite side surfaces 10b and 10c that oppose each other in the body 10, are respectively formed with an opposite pair of guide grooves 19 and 19. A pair of substages 18 and 18 opposite each other along this pair of guide grooves 19 and 19 each has a structure so that they can move at high accuracy in the direction of the secondary scan which is indicated by the arrows $C_1$ and $C_2$.

In addition, to both distal ends of the pair of substages 18 and 18 is provided a slide rail 16 at right angles to the guide grooves 19. A main stage 15 is provided on the slide rail 16 so that it can move at high accuracy in the direction of the primary scan along which the thermal resistor elements of the line thermal head 30 are arranged along the slide rail 16, that is, the direction indicated by the arrows $D_1$ and $D_2$.

Then, a base 17 that supports a recording head 20 which is to be described later, and which is provided with the line thermal head 30, is fixed to the main stage 15 by screws 17a.

More specifically, the recording head 20 has a structure whereby it moves in the directions of the secondary scan and the primary scan, so that it can move to an arbitrary position on the sheet of the recording material 12.

The moving mechanism of the recording head 20 that has the configuration described above is to be named as a recording head moving mechanism 14 hereinafter.

Moreover, the recording head moving mechanism 14 is provided with separate control apparatus and drive sources such as stepping motors or the like for the respective directions of the primary scan and the secondary scan, and which are not indicated in the figure but here, the respective descriptions of these portions are omitted.

The following is a description of the recording head 20, with reference to FIG. 1 and FIG. 2.

The recording head 20 is provided with a line thermal head 30 which is provided with one or more thermal resistor elements in the direction of primary scan. Further provided on the recording head 20 are a freely attachable and detachable transfer paper cassette 24 that is provided with a transfer paper supply roll 27 of the transfer paper 23 that is applied with ink of a single color such as black or the like, a transfer paper take-up roll 28 and a transfer paper take-up motor 34 that is the drive source for taking up the transfer paper 23.

Then, the recording head 20 is indirectly or directly supported by the base 17.

When recording, the line thermal head 30 that is provided with the thermal resistor elements can perform simultaneous recording of screen dots of a number corresponding to the number of thermal resistor elements.

To the base 17 is fixed a hydraulic cylinder 22 so as to press the line thermal head 30 into contact with the flat platen 11 via the transfer paper 23 and the sheet of the recording material 12. To the distal end portion of the hydraulic cylinder 22 is fixed a head base 21 that supports the transfer paper cassette 24, the line thermal head 30 and the transfer paper take-up motor 34.

Moreover, the pressure mechanism of the line thermal head 30 can also use a solenoid and a cam mechanism, instead of the hydraulic cylinder 22. If this is the case, then there is no obstruction when the recording head 20 is directly fixed to the base 17.

The head base 21 has a pair of guide rollers 29b and 29b attached to it via a pair of compression springs 31 and 31 so that the line thermal head 30 is sandwiched between the guide rollers 29b and 29b in the direction of movement of the transfer paper 23. When the line thermal head 30 is pressed into contact with the sheet of the recording material 12, the guide rollers 29b and 29b are pressed by the compression springs 31 and 31 so that the transfer paper 23 is pressed into contact with the sheet of the recording material 12 at the front and rear of the line thermal head 30 in the direction of movement of the transfer paper 23.

In addition, the above described transfer paper cassette 24 has its flat surface substantially in the shape of an inverted letter "U", and the transfer paper take-up roll 28 and the transfer paper supply roll 27 of the transfer paper 23 applied with the single-color ink that is black in color, for example, are so supported within the transfer paper cassette 24 that they are freely rotatable. The transfer paper 23 inside the transfer paper cassette 24 is guided by the pair of guide rollers 29a and 29a.

In addition, the recording head 20 is provided with a mounting and demounting mechanism (not indicated in the figure) so that the transfer paper cassette 24 can be mounted and demounted. The description of this is omitted here.

A gear 32 is provided on the same shaft as the transfer paper take-up roll 28 of the transfer paper cassette 24. When the transfer paper cassette 24 is mounted to the recording head 20, the gear 32 meshes with a drive gear 33 that is provided on the transfer paper take-up motor 34 to take up the transfer paper 23.

Figure 3:
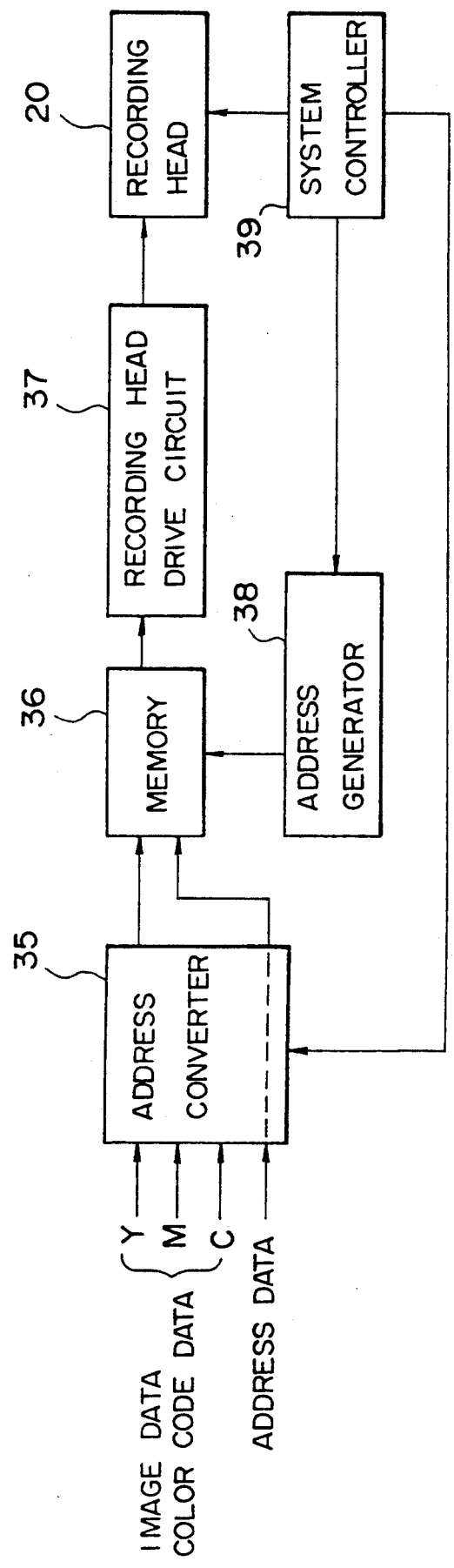
FIG. 3 is a block diagram showing the electrical configuration on the host computer side of the thermal color separation plate manufacturing apparatus shown in FIG. 1.

The electrical configuration on the host side of the thermal transfer color separation plate manufacturing apparatus is, as is shown in FIG. 3, configured from an address converter 35, a memory 36, a recording head drive circuit 37, an address generator 38, a system controller 39 and a recording head 20.

The electric signals corresponding to an original image, which are to be supplied to the thermal transfer color separation plate manufacturing apparatus, the same as the signal obtained by a conventional color scanner in the process of image reading and signal processing, are comprised of image data that is digitalized in accordance with the three colors of yellow (Y), magenta (M) and cyan (C), color code data that determines a conversion angle $\theta$ that will be described later, and address data that specifies the position of the image data on the original image, and these data are input to the address converter 35. The address data is address data prior to the conversion that will be described later.

Figure 4:
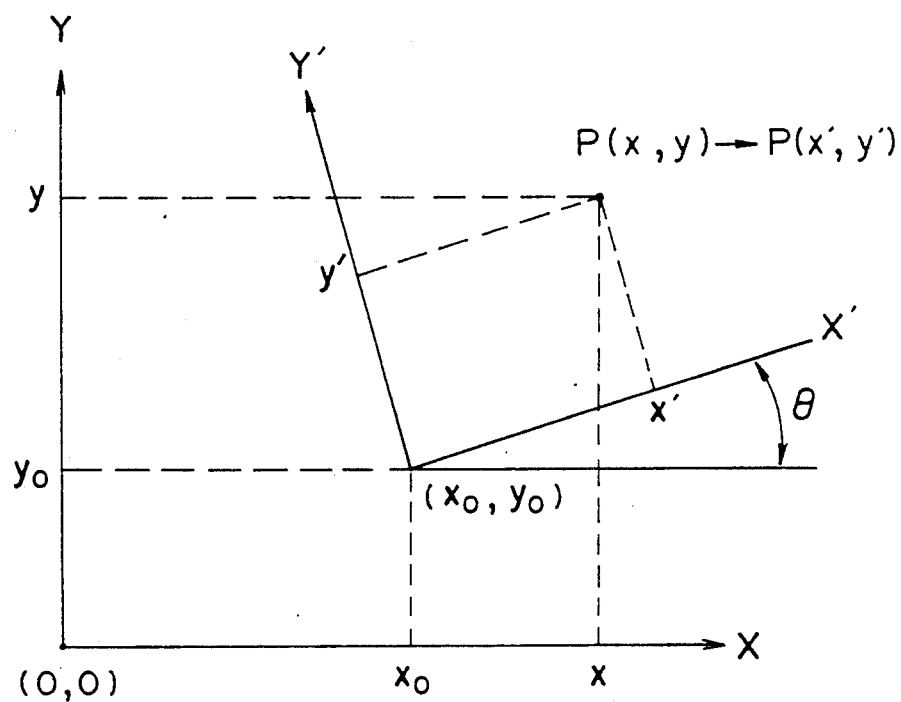
FIG. 4 is a graph showing the position of recording color signals by the recording head, and which are obtained by converting the coordinate axes by rotating a flat platen by a rotational angle corresponding to the color signals, in the thermal color separation plate manufacturing apparatus shown in FIG. 1.

Then, as shown in FIG. 4, responding to control signals from the system controller 39, the address data is converted into point P (x', y') at the new X'—Y' coordinate axes on the basis of the conversion angle $\theta$ determined by the color code data from the point P (x, y) at the conventional X—Y coordinate axes with respect to a scanner for the original image, and this converted address data is supplied to the memory 36 together with the image data, which is stored therein in accordance with the converted address data. After this, the image data is transferred to the recording head 20 via the recording head drive circuit 37 in accordance with an address data generated by the address generator 38.

Figure 6A:
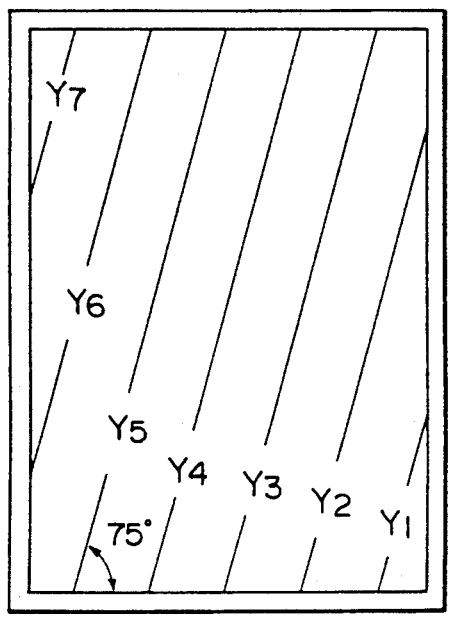
FIGS. 6A, 6B and 6C are schematic views showing the motion track of the recording head when there is recording, and the rotation angle for rotating the flat platen in accordance with the color signals that are to be recorded using the thermal color separation plate manufacturing apparatus shown in FIG. 1.
Figure 6B:
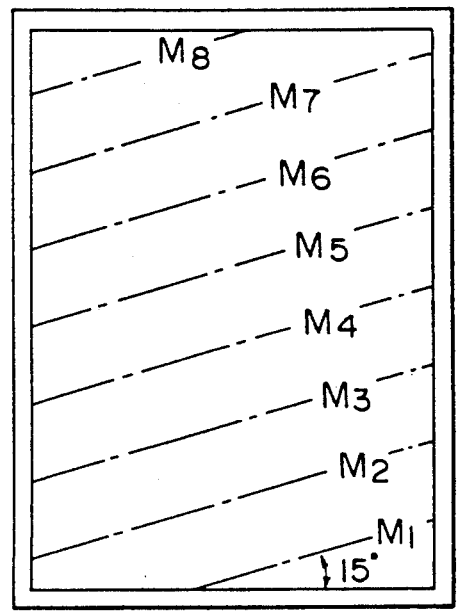
Figure 6C:
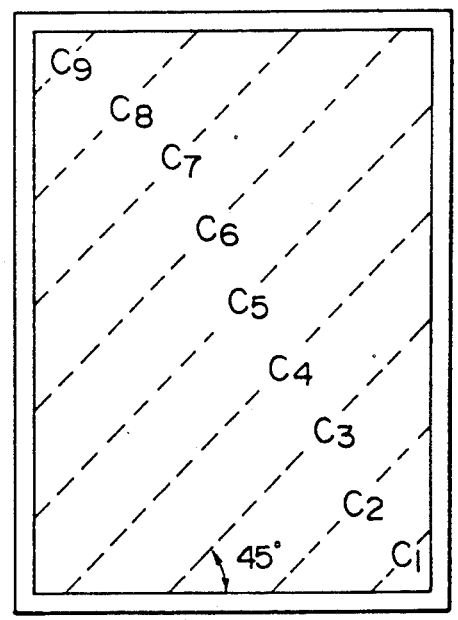

Moreover, when there is recording to the sheet of the transparent recording material 12, the conversion angle $\theta$ when there is conversion of the coordinate axes in FIG. 4 is the same as the rotation angle $\theta$ as shown in FIGS. 6A, 6B and 6C, for rotating the flat platen 11 by a specific angle in accordance with color signals to be recorded. This rotation angle $\theta$ (=conversion angle $\theta$) is calculated beforehand in accordance with the size and pitch of the recorded screen dots, so that the period of the moiré is as small as possible. Moreover, in the plural number of color separation plates corresponding to the plural number of color signals recording on the sheet of the transparent recording material 12, there is no generation of the moiré as there is single color recording by the recording operation that will be described later. Here, the moiré is generated when the plural number of color separation plates are used as the basis for the manufacture of a plural number of machine plates corresponding to each color, and when these are overlapped with each other to perform color printing in screen dot patterns.

Then, in the recording track due to the thermal resistor elements of the line thermal printer 30 used in this embodiment, for example, the rotation angle $\theta$ of magenta is set to 15 degrees, the rotation angle $\theta$ of cyan is set to 45 degrees and the rotation angle $\theta$ of yellow is set to 75 degrees in order that the spatial period of the moiré generation becomes minimum. Moreover, the value of the rotation angle $\theta$, is not a determined value, and changes in accordance with the size and pitch of the recorded screen dots.

The following is a description of the recording operation of the thermal transfer color separation plate manufacturing apparatus used in the method of manufacture of the color separation plate in the present embodiment, with reference to FIG. 1, FIG. 5, FIG. 6A, FIG. 6B and FIG. 6C.

The electric signal corresponding to a plural number of colors is for example, separated into the color signals of yellow, magenta and cyan for example, and supplied to this apparatus. Transfer paper 23 of the black color, for example is used to perform recording to the plural number of sheets of transparent recording material 12 by the recording track having a required angle corresponding to each of the color signals. Here, the plural number of sheets of the recording material 12 to which recording is performed are employed as the color separation plates (the color separation plate for yellow, the color separation plate for magenta and the color separation plate for cyan, for example) corresponding to the signals of each color. The following is a detailed description of the recording operation. Here, for example, the transfer paper cassette 24 to which the transfer paper 23 applied with black-ink is mounted is supported beforehand by the head base 21.

The description to follow is based on the premise that recording head 20 is moved by the recording head moving mechanism 14 in accordance with the address data converted to the previously described X'—Y' coordinate axis.

First, a sheet of transparent recording material 12 is mounted along the reference lines (not shown in the figure) on the flat platen 11. Here, the flat platen 11 is positioned at a position (rotation angle $\theta=0$ degrees) that becomes the reference. Then, when the flat platen 11 is at the rotation angle $\theta=0$ degrees, the reference lines for mounting the sheet of the recording material 12 is formed parallel to the slide rail 16 and the guide groove 19 shown in FIG. 1.

After this, the flat platen 11 is rotated in the directions of the arrows B₁ and B₂ shown in FIG. 1, by the required angle (rotation angle $\theta$) corresponding to the color signals to be recorded. Then, the flat platen 11 is fixed when it reaches the position equivalent to the required angle.

For example, when a yellow color separation plate is manufactured, a yellow color signal is supplied to the line thermal head 30 of the recording head 20. Then, the flat platen 11 rotates in the direction of the arrow $B_2$ shown in FIG. 1. As shown in FIG. 6A, the flat platen 11 is fixed when the flat platen 11 has reached a position equivalent to the rotation angle $\theta = 75$ degrees for the yellow color (step 11 of FIG. 5).

Figure 5:
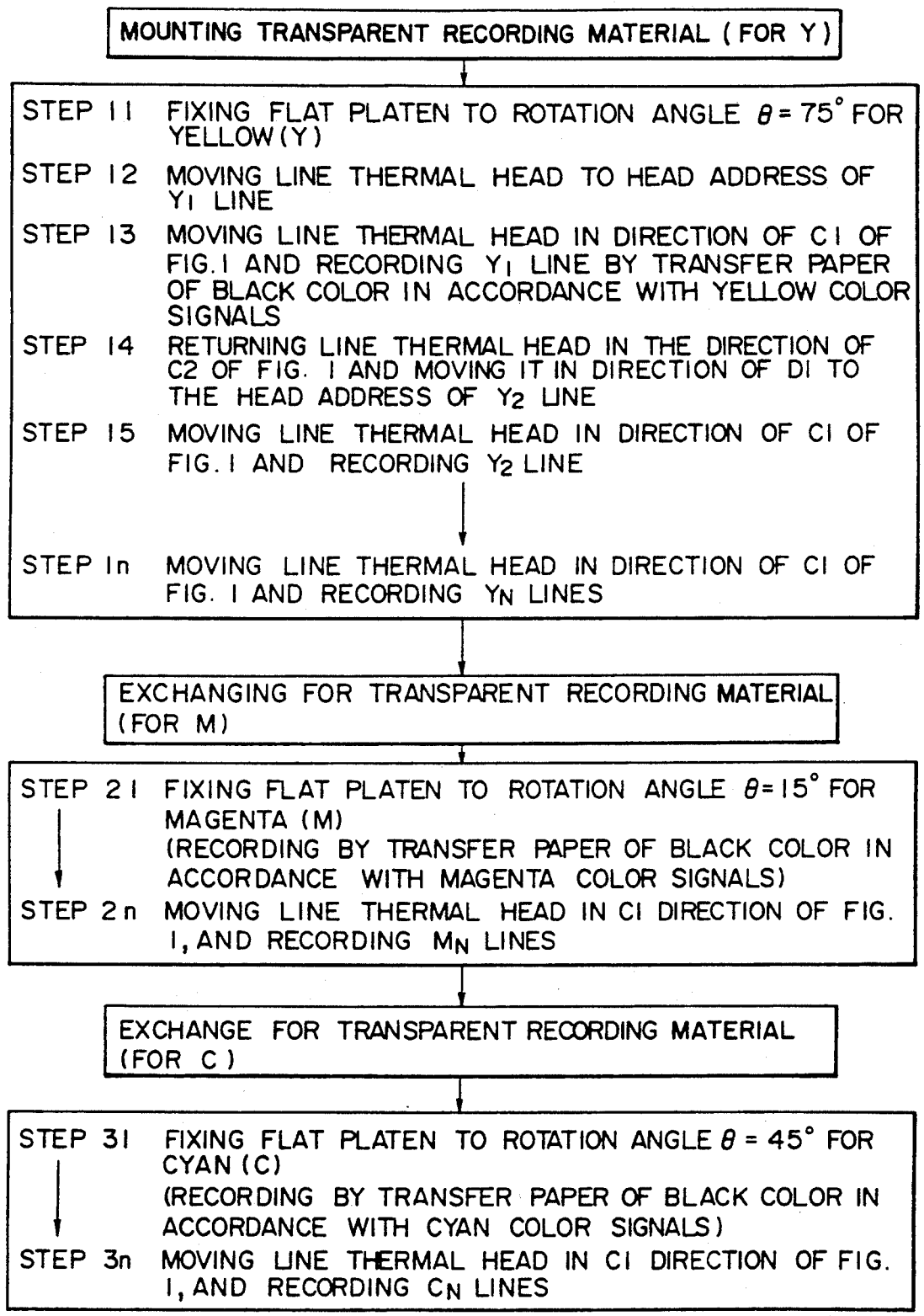
FIG. 5 is a flow chart for describing the operation of the thermal color separation plate manufacturing apparatus shown in FIG. 1.

Then, the recording head 20 is moved to the head address of the $Y_1$ line converted by the rotation angle $\theta$ (conversion angle $\theta$) = 75 degrees (step 12 of FIG. 5).

The recording head moving mechanism 14 freely moves the recording head 20 in the directions of the arrows $D_1$ and $D_2$ and the arrows $C_1$ and $C_2$ shown in FIG. 1, and to the head address of the $Y_1$ line.

After this, the recording head 20 moves in the direction shown by the arrow $C_1$ (direction of the secondary scan of the sheet of the recording material 12) and the line thermal head 30 records the $Y_1$ line in accordance with the yellow color signal on the sheet of the transparent recording material 12 by the black ink applied to the transfer paper 23 (step 13 of FIG. 5). When the recording of the $Y_1$ line is completed, the recording head 20 returns at high speed in the direction the arrow $C_2$ and moves in the direction of the arrow $D_1$. When the recording head 20 has reached the head address of the $Y_2$ line (step 14 of FIG. 5), the same recording operation as that described above is used to perform recording of the $Y_2$ line onto the recording material 12 (step 15 of FIG. 5). After this, the recording operation described above for the recording head 20 is repeated and the $Y_n$ line is recorded to the sheet of the recording material 12 and the recording operation for yellow is completed (step 1n of FIG. 5).

The sheet of the transparent recording material 12 to be the color separation plate for the yellow color and for which recording has been completed, is removed from the flat platen 11 and a new sheet of transparent recording material 12 to be the color separation plate for the magenta color is placed on the flat platen 11.

Then, as shown in FIG. 6B, the flat platen 11 is rotated to a position having the rotation angle $\theta = 15$ degrees for magenta, and is fixed there (step 21 in FIG. 5). More specifically, the flat platen 11 is returned from the position for yellow, and in the direction of the arrow $B_1$ shown in FIG. 1, and is fixed at the position of the rotation angle $\theta = 15$ degrees for magenta. After this, the same method as that used for the yellow recording is used to perform recording operation for magenta from the line $M_1$ to the line $M_n$ as shown in FIG. 6B, and the recording operation for magenta is completed (step 2n of FIG. 5). Moreover, in the recording operation for magenta, the lines $M_1$ through $M_n$ are transferred to and recorded onto the sheet of the transparent recording material 12 by the ink of the black color which has been applied to the transfer paper 23, in accordance with the color signals for magenta.

When the recording operation for the magenta color is completed, the sheet of the transparent recording material 12 for which recording is completed is exchanged with a new recording material 12 to be the color separation plate for cyan.

Then, as shown in FIG. 6C, the flat platen 11 is rotated to the position of the rotation angle $\theta = 45$ degrees for cyan, and is fixed there (step 31 of FIG. 5). More specifically, the flat platen 11 is rotated from the position for magenta, and in the direction shown by the arrow $B_2$ in FIG. 1, and the flat platen 11 is fixed at the position of the cyan rotation angle $\theta = 45$ degrees. After this, the same method as has been described above is used to perform cyan recording operation for from line $C_1$ to line $C_n$ and the recording operation for cyan finishes (step 3n of FIG. 5). Moreover, in the cyan recording, the lines $C_1$ through $C_n$ are recorded in accordance with the color signals for cyan, onto the sheet of the transparent recording material 12 by the black ink that has been applied to the transfer paper 23.

When the recording operation described above is completed, the color separation plate for the yellow color, the color separation plate for the magenta color and the color separation plate for the yellow color are obtained.

This plural number of color separation plates corresponding to a plural number of color signals are used as the basis for the manufacture of a plural number of machine plates corresponding to the plural number of colors, and these are then overlapped with each other and screen dot pattern color printing is performed to obtain high-quality color printing that has no moiré. The description of the operation of performing the screen dot pattern color printing is omitted here. In addition, the color signals that are separated in accordance with a plural number of colors are not limited to the three colors of yellow, magenta and cyan.

In this manner, the method according to the present invention for the manufacture of color separation plates does not involve the performance of conventional processing such as photographic exposure and developing and the like and it is possible to use a printing method for a thermal transfer type of printer. Because of this, it is possible to easily manufacture color machine plates and for the running cost to be reduced. Furthermore, it is also possible to perform correction work in a short time, and therefore enable fast response when time is limited.

This invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

We claim:

1. A method for manufacturing a color separation plate for dot color printing, the plate having dots recorded thereon, the size of the dots corresponding to the density of one of a plurality of primary colors of an image to be printed by means of one of a plurality of color signals corresponding to respective primary colors, the color signals being obtained by a scanner which reads out the image and generates an electric signal including address data of the image and separates the electric signal into the color signals, comprising the steps of:

setting a sheet of recording material for thermal transfer recording on a flat platen provided on a rotable mount;

rotating the mount by a specific predetermined angle corresponding to size and pitch of the dots on one of the primary colors with respect to moire generated in the dot color printing;

transforming the address data to new address data with respect to said specific angle;

setting a transfer paper with ink on said recording material;

applying one of the color signals to a thermal head to make the head scan the transfer paper according to the new address data; and transferring the ink of the thermal paper to the recording material to record dots corresponding to one of the color signals on the recording material, so that the recording material with the dots recorded thereon becomes the color separation plate.

2. The method as claimed in claim 1, wherein said transforming step further comprises:

rotating coordinate axes having the address data read out by the scanner located thereon by said specific angle and relocating the address data on the coordinate axes thus rotated.

* * * * *